(12) United States Patent
Sugawara et al.

(10) Patent No.: US 6,342,709 B1
(45) Date of Patent: Jan. 29, 2002

(54) INSULATED GATE SEMICONDUCTOR DEVICE

(75) Inventors: Yoshitaka Sugawara, Higashiosaka; Katsunori Asano, Nara, both of (JP)

(73) Assignees: The Kansai Electric Power Co., Inc., Osaka; Hitachi, Ltd., Tokyo, both of (JP)

( * ) Notice: Subject to any disclaimer, the term of this patent is extended or adjusted under 35 U.S.C. 154(b) by 0 days.

(21) Appl. No.: 09/117,997
(22) PCT Filed: Dec. 10, 1997
(86) PCT No.: PCT/JP97/04538
  § 371 Date: Aug. 11, 1998
  § 102(e) Date: Aug. 11, 1998
(87) PCT Pub. No.: WO98/26458
  PCT Pub. Date: Jun. 18, 1998

(51) Int. Cl.[7] .............................................. H01L 33/00
(52) U.S. Cl. ...................................... 257/139; 257/138
(58) Field of Search .................................. 257/139, 138

(56) References Cited

U.S. PATENT DOCUMENTS 5,488,236 A  1/1996  Baliga et al.

FOREIGN PATENT DOCUMENTS

| EP | 0676814 | 10/1995 |
|----|---------|---------|
| EP | 0717450 | 6/1996 |
| GB | 2269050 | 1/1994 |
| JP | 1-192174 | 8/1989 |
| WO | 9214269 | 8/1992 |

*Primary Examiner*—Stephen D. Meier
(74) *Attorney, Agent, or Firm*—Antonelli, Terry, Stout & Kraus, LLP (57) ABSTRACT

In a semiconductor device having a trench type insulated gate structure, in the case where a drift layer 2 of an n-conduction type has a high carrier density, when a high voltage is applied between a drain and a source in such a manner that a channel is not formed, the electric field strength of an insulator layer 9 below the trench type insulated gate is increased, thus causing breakdown. The withstand voltage of the semiconductor device is limited by the breakdown of the insulator layer 9, and it is difficult to realize high withstand voltage.

In the characteristic of the present invention, a field relaxation semiconductor region 1 of a conduction type opposite to the conduction type of the drift layer 2 is formed within the drift layer 2 below the insulator layer 9 in the trench of the trench type insulated gate semiconductor device. Also, the thickness of a bottom portion of the insulator layer 9 provided in the trench of the trench type insulated gate semiconductor device is made significantly greater than the thickness of a lateral portion thereof.

20 Claims, 6 Drawing Sheets

INSULATED GATE SEMICONDUCTOR DEVICE

TECHNICAL FIELD

The present invention relates to an insulated gate semiconductor device used as a switching device.

BACKGROUND ART

Conventionally, MOSFET and Insulation Gate Type Bipolar Transistor (hereinafter referred to as IGBT) are well known as vertical type power semiconductor devices which have advantages in high speed switching characteristics, high input impedance and low input loss. In order to reduce the resistance of the junction field effect transistor (hereinafter referred to as JFET) immanent in above individual semiconductor devices and establish low-loss, what are used for both transistors are semiconductor devices having a trench type insulated gate structure having a gate 14 in the concave portion 29 as shown in FIGS. 11 and 12.

Figure 11:
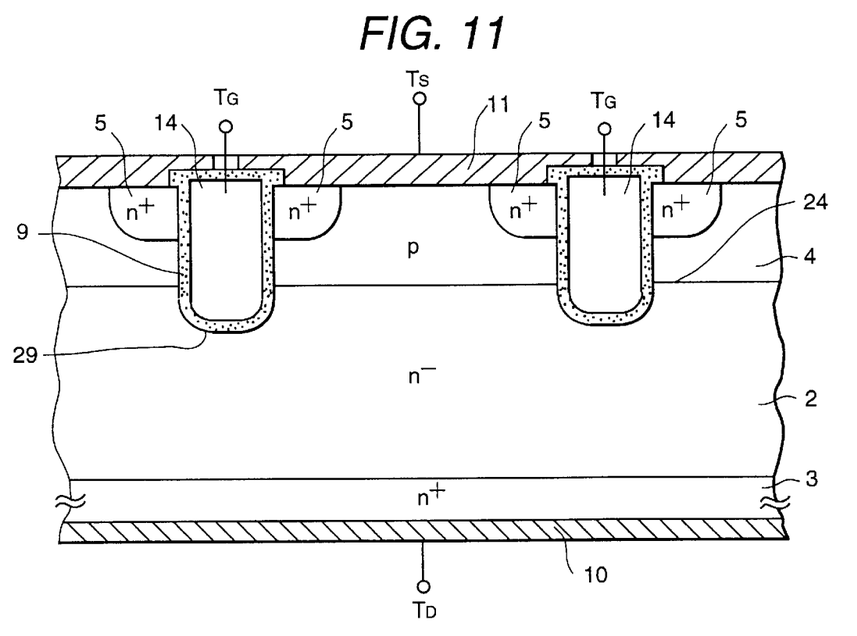
FIG. 11 is a cross-sectional view of the insulated gate semiconductor device of conventional MOSFET.
Figure 12:
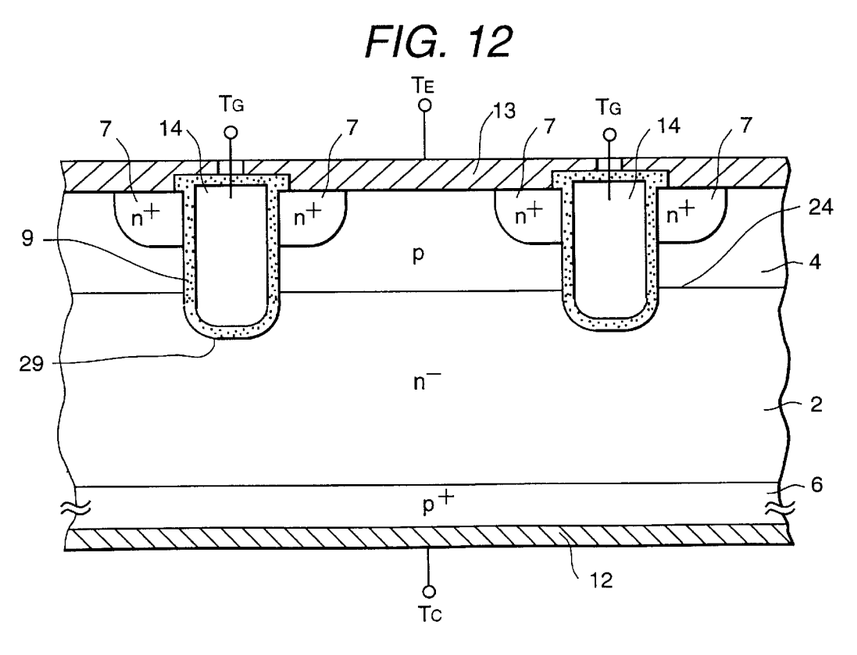
FIG. 12 is a cross-sectional view of the insulated gate semiconductor device of conventional IGBT.

In such conventional semiconductor devices having a trench type insulated gate structure as shown in FIGS. 11 and 12, in case that the carrier density in the n− conduction type drift layer 2 as a semiconductor substrate having the first conduction type (n) is larger, the formation of a channel is blocked by making the gate electric potential smaller than the source electric potential (equivalent to the emitter electric potential in FIG. 12). In this case, if a high voltage having straight polarity is applied between the drain and the source (equivalently between the collector and the emitter in FIG. 12), a depletion layer is developed at the junction between the n− conduction type drift layer 2 and the p conduction type body layer 4 as a semiconductor layer formed on a surface portionially or wholly of the semiconductor substrate with the first conduction type, having the second conduction type (p) opposite to the first conduction type (n) and forming a junction with the n− conduction type drift layer 2.

However, as the carrier density of the n− conduction type drift layer 2 is high below the gate 14 and the electric conductivity is larger, the resistance of the layer becomes smaller. As a result, the voltage applied at the n− conduction type drift layer 2 becomes smaller, and thus, a high voltage is applied at the bottom portion of the insulation layer 9 formed in the inner surface of the concave portion 29. Owing to this characteristic, as the electric field strength at the bottom portion in the insulation layer 9 at the bottom portion of the trench type insulated gate becomes higher, the withstand voltage of the insulator layer 9 is bound at most up to the level at the insulation breakdown, and hence, the high-voltage adaptability of the device can not be easily established. In addition, as the higher electric field strength in the insulator layer 9 leads to the deterioration of the insulator layer 9, the establishment of higher reliability of devices is difficult.

DISCLOSURE OF INVENTION

An object of the present invention is to provide a insulated gate semiconductor device having high-voltage adaptability and high reliability which allows to relax the electric field strength at the bottom portion of the trench type insulated gate.

In order to solve the above described problems, in the present invention, a first semiconductor region having a second conduction type formed in the semiconductor substrate, that is, a semiconductor region for the relaxation of the electric field is defined at the bottom portion of the trench type insulated gate.

A characteristic of the present invention is based on a insulated gate semiconductor device having a semiconductor substrate having a first conduction type, a semiconductor layer of the second conduction type opposite to the first conduction type formed on the semiconductor substrate and forming a junction with the semiconductor substrate, at least one concave portion penetrating the semiconductor layer and reaching and cutting portionially the semiconductor substrate, a first semiconductor region of the second conduction type formed in the semiconductor substrate at the bottom portion of the concave portion, an insulator layer formed on the internal surface of the concave portion, a gate insulated by the insulator layer with the substrate and the semiconductor layer and at least portionially formed in the concave portion, a second semiconductor layer of the first conduction type formed at the surface of the semiconductor layer of the second conduction type with a designated depth at the peripheral area of the gate surrounded by the insulator layer in the semiconductor layer, a first electrode formed on the semiconductor layer of the second conduction type and the semiconductor region and defined to be electrically conduction to the semiconductor layer of the second conduction type and the semiconductor region, and a second electrode defined at another portion of the semiconductor substrate.

According to the present invention, by means of forming a semiconductor region below the trench type insulated gate of the trench type insulated gate semiconductor device for the relaxation of the electric field, in case of applying a voltage with a straight polarity between the drain and the source (or between the collector and the emitter), if the drift layer is a first conduction type in FIGS. 1 to 10, a depleted layer develops in the body layer of the second conduction type and the drift layer of the first conduction type. On the other hand, at the bottom of the trench type insulated gate electrode, a depleted layer extends from the junction between the semiconductor layer for the relaxation of the electric field and the drift layer of the first conduction type in responsive to the voltage between the drain and the source (or between the collector and the emitter), and the almost all of the applied voltage is supported by the semiconductor region for electric field relaxation and the drift layer of the first conduction type. As a result, the voltage assigned to the bottom portion of the insulator layer of the gate becomes smaller and the electric field strength of the insulator layer is relaxed, and consequently, higher high-voltage adaptability or higher reliability of the semiconductor device can be achieved.

The word "trench" used in the present invention relates to a concept including various types of holes and concave portions other than channels.

Another characteristic of the present invention is that the thickness of the insulator layer of the bottom portion of the trench type insulated gate is made to be much larger than the thickness of the lateral insulator layer. Owing to this structure, higher high-voltage adaptability or higher reliability of the semiconductor device can be achieved. In this case, by forming a semiconductor region for the electric field relaxation much higher high-voltage adaptability or higher reliability of the semiconductor device can be achieved.

BEST MODE FOR CARRYING OUT THE INVENTION

Now, an embodiment of the present invention will be described by referring to the drawings.

The insulated gate semiconductor device of the present invention has the following embodiment.

On a semiconductor substrate having a first conduction type, a semiconductor layer of a second conduction type opposite to the first conduction type and forming a junction to the semiconductor substrate is formed, and additionally, a concave portion is defined so as to penetrate the semiconductor layer and reach and cut partially the semiconductor substrate. A first semiconductor region of the second conduction type is formed in the semiconductor substrate at the bottom portion of the concave portion. An insulator layer is formed on the internal surface of the concave portion, and at least a portion of the gate insulated by the insulator layer with the semiconductor substrate and the semiconductor layer of the second conduction type is formed in the concave portion. In addition, at the peripheral area of the gate surrounded by the insulator layer in the semiconductor layer, a second semiconductor layer of the first conduction type is formed at the surface of the semiconductor layer of the second conduction type at the peripheral area of the gate with a designated depth. In addition, a first electrode is formed on the semiconductor layer of the second conduction type and the second semiconductor region so as to be electrically conduction to the semiconductor layer of the second conduction type and the second semiconductor region, and a second electrode is defined at another portion of the semiconductor substrate.

Further, on the semiconductor substrate, there are provided an electric conductor layer having the conduction type identical to that of semiconductor substrate on the semiconductor layer having an electric conductivity higher than that of semiconductor substrate.

The electric conductivity of the second substrate region is higher than that of the portion of the semiconductor substrate forming a junction to the semiconductor layer of the second conduction type.

A layer of the second conductivity is formed on the surface opposite to the surface of the substrate having the junction.

The second semiconductor region of the third conduction type is defined so as to be separated from the concave portion in the semiconductor substrate.

A layer of the second conductivity is formed on the surface opposite to the surface of the substrate having the junction, and the second semiconductor region of the third conduction type is defined so as to be separated from the concave portion in the semiconductor substrate.

The second electrode is formed at the position on the semiconductor substrate kept at a designated distance from the first electrode.

The first semiconductor region of the second conduction type formed in the semiconductor substrate is formed at the bottom portion of the concave portion and at the lateral portion connected to the bottom portion.

Another insulated gate semiconductor device of the present invention has the following embodiment.

On a semiconductor substrate having a first conduction type, a semiconductor layer of a second conduction type opposite to the first conduction type and forming a junction to the semiconductor substrate is formed, and additionally, a concave portion is defined so as to penetrate the semiconductor layer and reach and cut partially the semiconductor substrate. An insulator layer having a bottom portion thicker than the lateral portion is formed on the internal surface of the concave portion, and at least a portion of the gate insulated by the insulator layer with the semiconductor substrate and the semiconductor layer of the second conduction type is formed in the concave portion. In addition, at the peripheral area of the gate surrounded by the insulator layer in the semiconductor layer, a second semiconductor layer of the first conduction type is formed at the surface of the semiconductor layer of the second conduction type at the peripheral area of the gate with a designated depth. In addition, a first electrode is formed on the semiconductor layer of the second conduction type and the second semiconductor region so as to be electrically conduction to the semiconductor layer of the second conduction type and the second semiconductor region, and a second electrode is defined at another portion of the semiconductor substrate.

A layer of the second conductivity is formed on the surface opposite to the surface of the substrate having the junction.

As for the insulator layer formed on the inner surface of the concave portion, the thickness of the insulator layer at the bottom portion of the insulator layer is about approximately 5 times to approximately 20 times larger than the thickness of the insulator layer at the lateral portion of the concave portion.

The thickness of the insulator layer formed at the bottom portion of the concave portion is between approximately 0.5 $\mu$ and approximately 2 $\mu$. In the present invention, the numerals shown above as approximately 5, 20 and 0.5 should be interpreted to contain an range of approximately 20% error.

EMBODIMENTS

By referring to FIGS. 1 to 10, embodiments of the present invention will be described.

Embodiment 1

Figure 1:
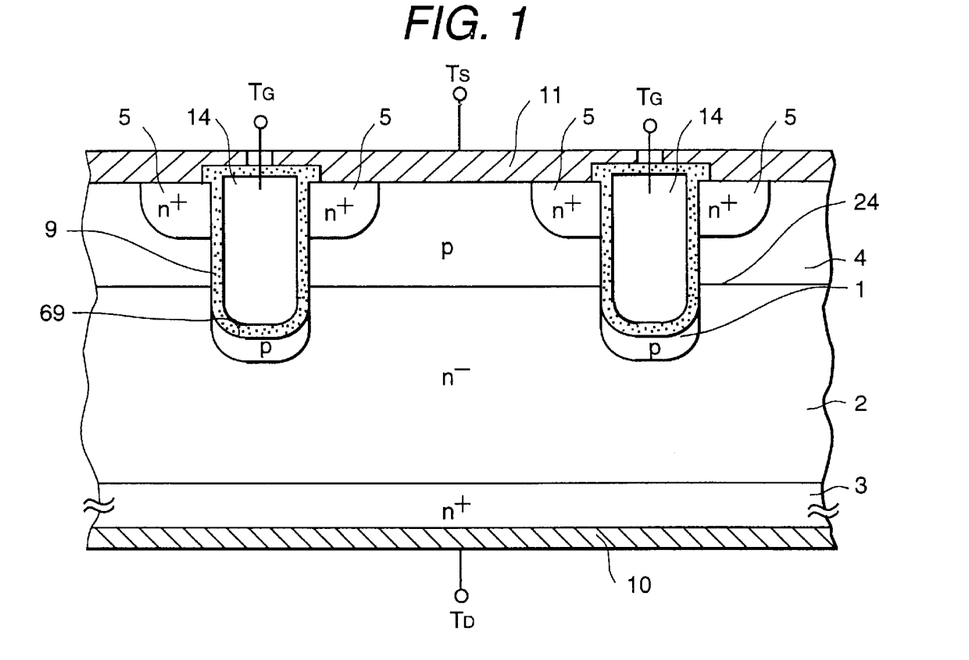
FIG. 1 is a cross-sectional view of the insulated gate semiconductor device of the embodiment 1 of the present invention.

FIG. 1 shows a cross-sectional view of the unit segment of n channel SiC(silicon carbide) MOSFET of withstand voltage 2500V class in the embodiment 1 of the present invention. In FIG. 1, TS is a source terminal, TD is a drain terminal, and TG is a gate terminal In this embodiment, the segment width is 5 μm and its depth is 1 mm. Other structural specifications are defined as below. The n− conduction type drift layer 2 is formed on the n+ conduction type drain layer 3 and its thickness is approximately 20 μm. The thickness of the n+ conduction type drain layer 3 is about 300 μm, the thickness of the p conduction type body layer 4 is 4 μm, the junction depth of the p+ conduction type source region 5 and the p conduction type electric field relaxation semiconductor region 1 is individually 0.5 μm, the depth of the concave portion, that is, trench 69 is 6 μm, and the width of the trench is 3 μm, the thickness of the insulator layer 9 such as SiO2 (silicon oxide) formed in side the trench 96 is 0.1 μm at the bottom portion and lateral portion of the trench 69, respectively.

In this embodiment, the trench type insulated gate electrode 14 is shaped in a stripe extended in the depth direction vertical to the surface of the drawing sheet. The projected shape of the trench may be a circular hole having a 3 μm diameter or a square other than a stripe extended in the depth direction vertical to the surface of the drawing sheet. The trenches are arranged at regular intervals, for example, with 5 μm pitch. In case of a circular trench, trenches may be arranged on a rectangular grid vertically and horizontally or on a staggered grid diagonally.

A specific method of fabricating the device of this embodiment is described as below. At first, what is prepared is an n+ type SiC (silicon carbide) substrate 3 to be used as a drain region composed of SiC with the density between $10^{18}$ atm/cm$^3$ and $10^{20}$ atm/cm$^3$, for example, $10^{19}$ atm/cm$^3$. An n− conduction type drift layer 2 composed of SiC with the density between $10^{15}$ atm/cm$^3$ and $10^{16}$ atm/cm$^3$, for example, $5\times10^{16}$ atm/cm$^3$ is formed on the whole surface of the substrate 3 by vapor phase epitaxy method and so on. Next, a p conduction type body layer 4 composed of SiC with the density about $10^{16}$ atm/cm$^3$ is formed on the drift layer 2 by vapor phase epitaxy method and so on. An n+ conduction type region 5 with the density about $10^{18}$ atm/cm$^3$ is formed selectively as a source layer by nitrogen ion implantation method and so on. (phosphoric ion, etc. may be used instead of nitrogen ion.)

Next, as shown in FIG. 1, a comprehensive substrate including the substrate 3, the drift layer 2 and the body layer 4 is processed by anisotropic etching, and a trench (channel) 69 penetrating the p conduction type body layer 4 and with its bottom portion reaching the n− conduction type drift layer 2 is formed. A p conduction type electric field relaxation semiconductor region 1 having the depth of 0.5 μm and the density of approximately $10^{17}$ atm/cm$^3$ is formed at the bottom portion by boron (or alternatively aluminum) ion implantation method and so on. Next, after forming an gate insulator film 9 composed of SiO2 on the inner surface of the trench 69, poly-silicon is made to be deposited in the trench 69 as a gate region containing high-density phosphor, and thus, the gate region 14 is formed in the trench 69. For example, the depth of the trench 69 is 6 μm, its width is 3 μm and its length is 1 mm. This size is an example but can be modified if necessary. By removing excess poly-silicon on the surface of the substrate other than the poly-silicon in the trench 69, the trench type insulated gate electrode 14 is formed. Finally, by means of aluminum (or alternatively nickel), a source electrode 11 is formed on the surface of the substrate and a drain electrode 10 is formed on the rear face of the substrate, and an insulated gate semiconductor device (MOSFET) is obtained. An ON resistance of this MOSFET device is about 30 mΩcm$^2$.

The device of this embodiment is an n channel SiC MOSFET, in which the gate voltage to be applied is so adjusted that the electric potential of the drain electrode 10 may be higher than the electric potential of the source electrode 11 and that the electric potential of the trench type insulated gate electrode 14 may be higher than the electric potential of the source electrode 11. In case that the gate voltage becomes higher than a designated threshold voltage, an n conduction type channel is formed on the surface of the p conduction type body layer 4 at the lateral of the trench type insulated gate electrode 14. Then, electrons flow from the n+ conduction type source region 5 through the channel to the n− conduction type drift layer 2 and furthermore to the n+ conduction type drain layer 3, and consequently, the semiconductor device is turned on. In contrast, in case that the gate voltage is so adjusted that the electric potential of the trench type insulated gate electrode 14 may be smaller than the electrode of the source electrode 11, and that the electric potential of the drain electrode 10 may be higher than the electric potential of the source electrode 11, depletion layers are extended at the both sides of the junction between the n− conduction type drift layer 2 and the p conduction type body layer 4. Owing to those depletion layer, the electric field strength can be relaxed and a high withstand voltage can be established for high voltage application.

In this embodiment, other than depletion layers extended at the both sides of the junction 24, depletion layers are also developed at the junction between the p conduction type electric field relaxation semiconductor region 1 below the trench type insulated gate electrode 14 and the n− conduction type drift layer 2, and thus, a high withstand voltage can be established for high voltage application. Therefore, below the trench type insulated gate electrode 14, almost all of the applied voltage is supported by the electric field relaxation semiconductor region 1 and the n− conduction type drift layer 2. Hence, the voltage applied to the insulator layer 9 below the bottom portion of the gate becomes smaller and the electric field strength in the insulator layer 9 is relaxed. Thus, the electric f field strength in the gate insulator layer 9 can be relaxed and a high withstand voltage can be established for high voltage application, and the reliability of the gate insulator layer 9 can be also increased.

In the computational simulation, in case of a conventional trench type insulated gate MOSFET shown in FIG. 11, the trench type insulated gate electrode 14 and the source electrode 11 are made short and the electric potential of the source electrode 11 is set to be 0V and +2000V is applied to the drain electrode 10, the electric field strength of the insulator layer 9 composed of SiO2 at the bottom portion of the trench type insulated gate comes close to the value between 6 to 10 MV/cm equivalent to the breakdown electric field strength of SiO2, and the withstand voltage of the semiconductor device is 2000V which is determined by the withstand voltage of the SiO2 insulation film. In contrast, in case of such a device as MOSFET in this embodiment in which the electric field relaxation semiconductor region 1 is formed below the trench type insulated gate 14, the electric field strength of the SiO2 insulator layer 9 at the bottom portion and the lateral end portion of the trench type insulated gate is reduced by 15 to 30% in comparison with the conventional device. As a result, it is proved that the withstand voltage of the semiconductor device increases from 2300V to 2600V.

In the conventional device in which the electric field relaxation semiconductor region 1 is not formed below the trench type insulated gate 14, the voltage applied to the drain electrode 10 is supported by the n− conduction type drift layer 2 and the insulator layer 9 at the bottom portion of the trench type insulated gate 14, and as the voltage applied to the insulator layer 9 becomes larger and, consequently, the electric field strength in the insulator layer 9 becomes larger and the withstand voltage of the semiconductor device itself is determined by the withstand voltage of the insulator layer. However, in case that the electric field relaxation semiconductor region 1 is now formed below the trench type insulated gate 14, the applied voltage is distributed and supported by the electric field relaxation semiconductor region 1, the n− conduction type drift layer 2 and the insulator layer 9 at the bottom portion of the trench type insulated gate. Specifically, almost whole portion of the voltage applied between the drain and the source is supported by the neighboring region of the junction between the electric field relaxation semiconductor region 1 and the n− conduction type drift layer 2. Thus, the voltage applied to the insulator layer 9 at the bottom portion of the trench type insulated gate 14 becomes smaller, and consequently, the electric field strength of the insulation layer 9 becomes smaller. In case of the device having higher withstand voltage, as the electric field strength becomes specifically higher, the effect brought by the structure in which the electric field relaxation semiconductor region 1 is formed below the trench type insulated gate becomes distinguished.

Embodiment 2

Figure 2:
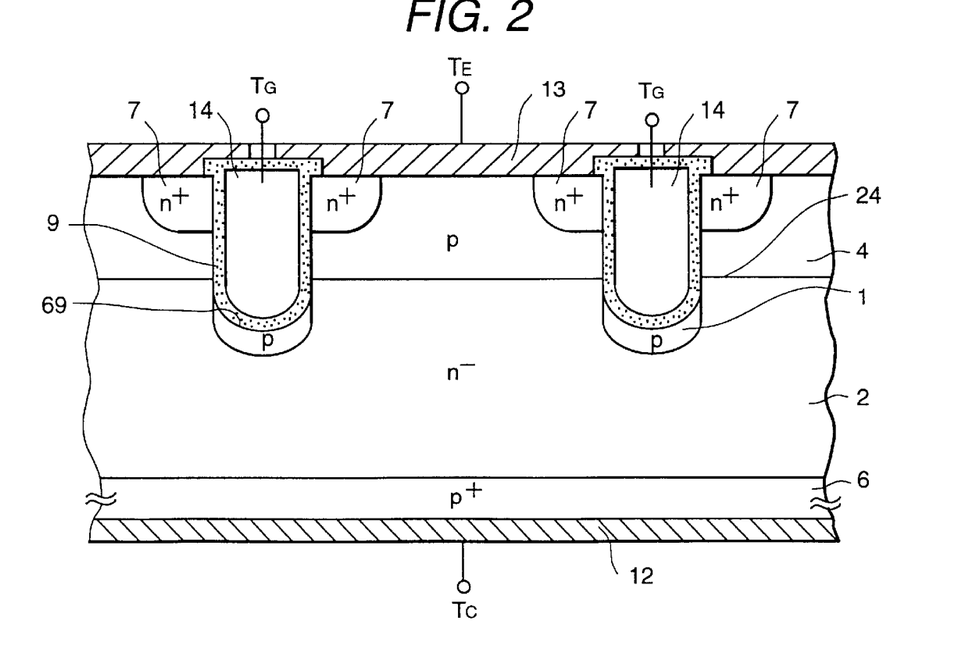
FIG. 2 is a cross-sectional view of the insulated gate semiconductor device of the embodiment 2 of the present invention.

FIG. 2 is a cross-sectional view of the unit of n channel SiC IGBT in the embodiment 2 of the present invention. In FIG. 2, TE is an emitter terminal, and TC is a collector terminal. In the structure of the device in FIG. 2 the p conduction type collector layer 6 is formed instead of the n+ conduction type drain layer 3 in the embodiment 1. In the structural specifications and fabrication method in the embodiment 2, a difference from the embodiment 1 is only that a SiC p+ conduction type substrate is used instead of a SIC n+ conduction type substrate, but other aspects are similar to the embodiment 1. The impurity density of the p+ conduction type substrate is between $10^{18}$ atm/cm$^3$ and $10^{19}$ atm/cm$^3$.

In the operation of the n channel IGBT of this embodiment, at first, the gate voltage to be applied is so adjusted that the electric potential of the collector electrode 12 may be higher than the electric potential of the emitter electrode 11 and that the electric potential of the trench type insulated gate electrode 14 may be higher than the electric potential of the emitter electrode 13. In case that the gate voltage becomes higher than a designated threshold voltage, an n conduction type channel is formed on the surface of the p conduction type body layer 4 at the lateral of the trench type insulated gate electrode 14, and then, electrons flow from the n+ conduction type emitter region 7 through the channel to the n− conduction type drift layer 2. With this operation, positive holes are injected from the p conduction type collector layer 6 to the n− conduction type drift layer 2, and then, the device is turned on. In this case, as a modulation in the electric conductivity is associated, ON resistance of IGBT is very small in comparison with very high ON resistance of MOSFET. In this embodiment, ON voltage is 1.5 V for the current 200A/cm$^2$ and ON resistance is 7.5 mΩcm$^2$. In case that the gate voltage is so adjusted that the electric potential of the trench type insulated gate electrode 14 may be smaller than the electrode of the emitter electrode 13, and that the electric potential of the collector electrode 12 may be higher than the electric potential of the emitter electrode 13, depletion layers are extended at the both sides of the junction between the n− conduction type drift layer 2 and the p conduction type body layer 4, and the electric field strength can be relaxed and a high withstand voltage can be established for high voltage application.

In this embodiment, other than the depletion layer supporting the applied voltage, depletion layers are developed also below the trench type insulated gate electrode 14 at the junction between the p conduction type electric field relaxation semiconductor region 1 and the n− conduction type drift layer 2, and thus, a high withstand voltage can be established for high voltage application. Therefore, below the trench type insulated gate electrode 14, almost all of the applied voltage is supported by the electric field relaxation semiconductor region 1 and the n− conduction type drift layer 2. Hence, the voltage applied to the insulator layer 9 below the bottom portion of the gate becomes smaller and the electric field strength in the insulator layer 9 is relaxed. Thus, the reliability of the gate insulator layer 9 can be also increased. In addition, the electric field strength in the gate insulator layer 9 can be relaxed and a high withstand voltage can be established for high voltage application. In this embodiment, similarly to the embodiment 1 for MOSFET, the electric field strength of the insulator layer 9 at the bottom portion and the lateral end portion of the trench type insulated gate 14 is reduced by 15 to 30% in comparison with the conventional IGBT having a structure without an electric field relaxation semiconductor region 1. Thus, also in this embodiment, as the electric field strength in the insulator layer 9 is relaxed, a high withstand voltage can be established for high voltage application, and the reliability of the gate insulator layer 9 can be also increased. For example, it is proved that the withstand voltage of the semiconductor device increases from 2300V to 2600V.

Embodiment 3

Figure 3:
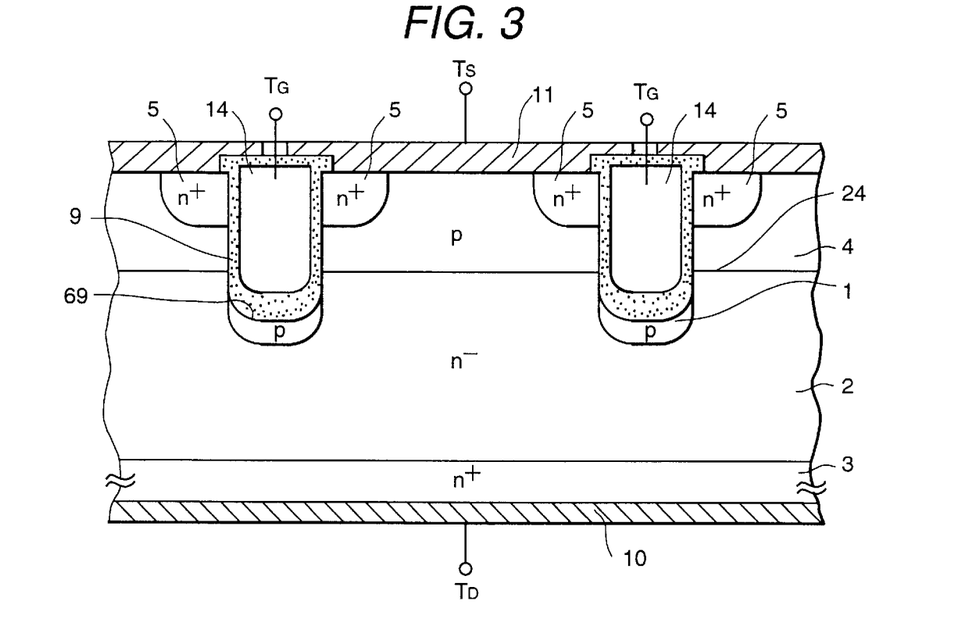
FIG. 3 is a cross-sectional view of the insulated gate semiconductor device of the embodiment 3 of the present invention.

FIG. 3 shows a cross-sectional view of the unit segment of n channel SiC(silicon carbide) MOSFET of withstand voltage 2500V class in the embodiment 3 of the present invention. In this embodiment, the segment width is 5 μm and its depth is 1 mm. Other structural specifications are defined as below. The n− conduction type drift layer 2 is formed on the n+ conduction type drain layer 3 and its thickness is approximately 20 μm. The thickness of the n+ conduction type drain layer 3 is about 300 μm, the thickness of the p conduction type body layer 4 is 4 μm, the junction depth of the p+ conduction type source region 5 and the p conduction type electric field relaxation semiconductor region 1 is individually 0.5 μm, the depth of the concave portion, that is, trench 69 is 6 μm, and the width of the trench is 3 μm, the thickness of the insulator layer 9 such as SiO2 (silicon oxide) formed in side the trench 96 is 0.5 μm at the bottom portion and 0.1 μm lateral portion of the trench 69, respectively. In this embodiment, the trench type insulated gate electrode 14 is shaped in a stripe extended in the depth direction vertical to the surface of the drawing sheet. The projected shape of the trench may be a circular hole having a 3 μm diameter or a square other than a stripe extended in the depth direction vertical to the surface of the drawing sheet. The trenches are arranged at regular intervals, for example, with 5 μm pitch. In case of a circular trench, trenches may be arranged on a rectangular grid vertically and horizontally or on a staggered grid diagonally.

A specific method of fabricating the device of this embodiment is described as below. At first, what is prepared is an n+ type SiC (silicon carbide) substrate 3 to be used as a drain region composed of SiC with the density between $10^{18}$ atm/cm$^3$ and $10^{20}$ atm/cm$^3$, for example, $10^{19}$ atm/cm$^3$. An n– conduction type drift layer 2 composed of SiC with the density between $10^{15}$ atm/cm$^3$ and $10^{16}$ atm/cm$^3$, for example, $5 \times 10^{16}$ atm/cm$^3$ is formed on the whole surface of the substrate 3 by vapor phase epitaxy method and so on. Next, a p conduction type body layer 4 composed of SiC with the density about $10^{16}$ atm/cm$^3$ is formed on the drift layer 2 by vapor phase epitaxy method and so on. An n+ conduction type region 5 with the density about $10^{18}$ atm/cm$^3$ is formed selectively as a source layer by nitrogen ion implantation method and so on. (phosphoric ion, etc. may be used instead of nitrogen ion.)

Next, as shown in FIG. 3, a comprehensive substrate including the substrate 3, the drift layer 2 and the body layer 4 is processed by anisotropic etching, and a trench (channel) 69 penetrating the p conduction type body layer 4 and with its bottom portion reaching the n– conduction type drift layer 2 is formed. A p conduction type electric field relaxation semiconductor region 1 having the depth of 0.5 μm and the density of approximately $10^{17}$ atm/cm$^3$ is formed at the bottom portion by boron (or alternatively aluminum) ion implantation method and so on. Next, after forming an gate insulator film 9 composed of SiO2 on the inner surface of the trench 69, poly-silicon is made to be deposited in the trench 69 as a gate region containing high-density phosphor, and thus, the gate region 14 is formed in the trench 69. For example, the depth of the trench 69 is 6 ?m, its width is 3 ?m and its length is 1 mm. This size is an example but can be modified if necessary. By removing excess poly-silicon on the surface of the substrate other than the poly-silicon in the trench 69, the trench type insulated gate electrode 14 is formed. Finally, by means of aluminum (or alternatively nickel), a source electrode 11 is formed on the surface of the substrate and a drain electrode 10 is formed on the rear face of the substrate, and an insulated gate semiconductor device (MOSFET) is obtained. An ON resistance of this MOSFET device is about 30 mΩcm$^2$.

The device of this embodiment is an n channel SiC MOSFET, in which the gate voltage to be applied is so adjusted that the electric potential of the drain electrode 10 may be higher than the electric potential of the source electrode 11 and that the electric potential of the trench type insulated gate electrode 14 may be higher than the electric potential of the source electrode 11. In case that the gate voltage becomes higher than a designated threshold voltage, an n conduction type channel is formed on the surface of the p conduction type body layer 4 at the lateral of the trench type insulated gate electrode 14. Then, electrons flow from the n+ conduction type source region 5 through the channel to the n– conduction type drift layer 2 and furthermore to the n+ conduction type drain layer 3, and consequently, the semiconductor device is turned on. In contrast, in case that the gate voltage is so adjusted that the electric potential of the trench type insulated gate electrode 14 may be smaller than the electrode of the source electrode 11, and that the electric potential of the drain electrode 10 ay be higher than the electric potential of the source electrode 1, depletion layers are extended at the both sides of the junction between the n– conduction type drift layer 2 and the p conduction type body layer 4. Owing to those depletion layer, the electric field strength can be relaxed and a high withstand voltage can be established for high voltage application.

In this embodiment, other than depletion layers extended at the both sides of the junction 24, depletion layers are also developed at the junction between the p conduction type electric field relaxation semiconductor region 1 below the trench type insulated gate electrode 14 and the n– conduction type drift layer 2, and thus, a high withstand voltage can be established for high voltage application. Therefore, below the trench type insulated gate electrode 14, almost all of the applied voltage is supported by the electric field relaxation semiconductor region 1 and the n– conduction type drift layer 2. Hence, the voltage applied to the insulator layer 9 below the bottom portion of the gate becomes smaller and the electric field strength in the insulator layer 9 is relaxed. Thus, the electric field strength in the gate insulator layer 9 can be relaxed and a high withstand voltage can be established for high voltage application, and the reliability of the gate insulator layer 9 can be also increased.

In the computational simulation, in case of a conventional trench type insulated gate MOSFET shown in FIG. 11, the trench type insulated gate electrode 14 and the source electrode 11 are made short and the electric potential of the source electrode 11 is set to be 0V and +2000V is applied to the drain electrode 10, the electric field strength of the insulator layer 9 composed of SiO2 at the bottom portion of the trench type insulated gate comes close to the value between 6 to 10 MV/cm equivalent to the breakdown electric field strength of SiO2. In contrast, in case of such a device as MOSFET in this embodiment in which the electric field relaxation semiconductor region 1 is formed below the trench type insulated gate 14 and the thickness of the bottom portion of the insulator layer 9 is made to be 0.5 μm and larger than the thickness of the literal of the insulator layer 9, the electric field strength of the SiO2 insulator layer 9 at the bottom portion and the lateral end portion of the trench type insulated gate is reduced by 45 to 65% in comparison with the conventional device. As a result, it is proved that the withstand voltage of the semiconductor device increases from 2900V to 3250V.

In the conventional device in which the electric field relaxation semiconductor region 1 is not formed below the trench type insulated gate 14, the voltage applied to the drain electrode 10 is supported by the n– conduction type drift layer 2 and the insulator layer 9 at the bottom portion of the trench type insulated gate 14, and as the voltage applied to the insulator layer 9 becomes larger and, consequently, the electric field strength in the insulator layer 9 becomes larger. However, in case that the electric field relaxation semiconductor region 1 is now formed below the trench type insulated gate 14, the applied voltage is distributed and supported by the electric field relaxation semiconductor region 1, the n– conduction type drift layer 2 and the insulator layer 9 at the bottom portion of the trench type insulated gate. Specifically, almost whole portion of the voltage applied between the drain and the source is supported by the neighboring region of the junction between the electric field relaxation semiconductor region 1 and the n– conduction type drift layer 2. Thus, the voltage applied to the insulator layer 9 at the bottom portion of the trench type insulated gate 14 becomes smaller, and consequently, the electric field strength of the insulation layer 9 becomes smaller. In case of the device having higher withstand voltage, as the electric field strength becomes specifically higher, the effect brought by the structure in which the electric field relaxation semiconductor region 1 is formed below the trench type insulated gate becomes distinguished.

Embodiment 4

Figure 4:
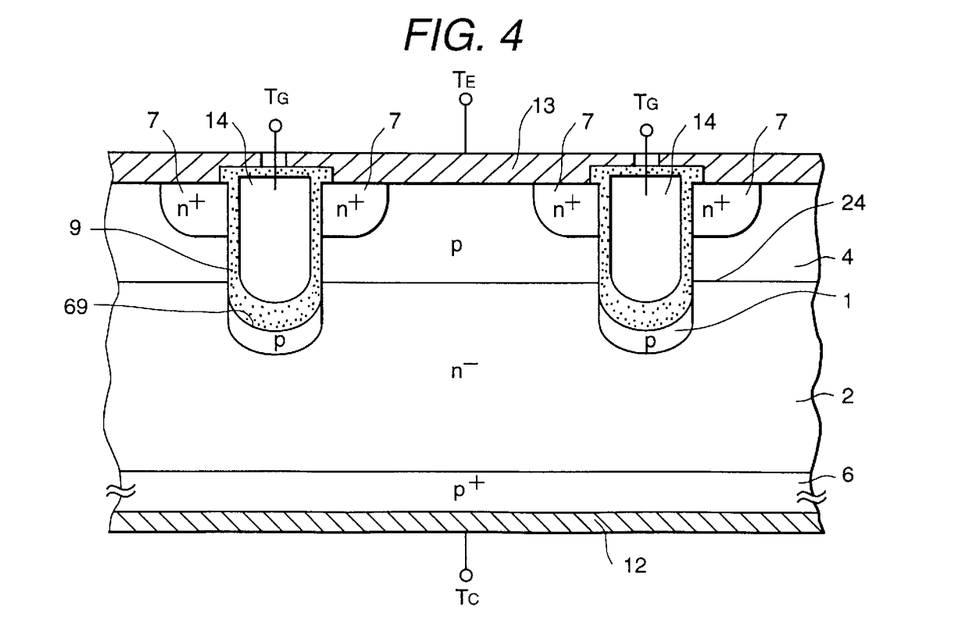
FIG. 4 is a cross-sectional view of the insulated gate semiconductor device of the embodiment 4 of the present invention.

FIG. 4 is a cross-sectional view of the unit of n channel SiC IGBT in the embodiment 4 of the present invention. In the structure of the device in FIG. 4, the p conduction type collector layer 6 is formed instead of the n+ conduction type drain layer 3 in the embodiment 1. In the structural specifications and fabrication method in the embodiment 2, a difference from the embodiment 1 is only that a SiC p+ conduction type substrate is used instead of a SIC n+ conduction type substrate, but other aspects are similar to the embodiment 1. The impurity density of the p+ conduction type substrate is between $10^{18}$ atm/cm$^3$ and $10^{19}$ atm/cm$^3$.

In the operation of the n channel IGBT of this embodiment, at first, the gate voltage to be applied is so adjusted that the electric potential of the collector electrode 12 may be higher than the electric potential of the emitter electrode 11 and that the electric potential of the trench type insulated gate electrode 14 may be higher than the electric potential of the emitter electrode 13. In case that the gate voltage becomes higher than a designated threshold voltage, an n conduction type channel is formed on the surface of the p conduction type body layer 4 at the lateral of the trench type insulated gate electrode 14, and then, electrons flow from the n+ conduction type emitter region 7 through the channel to the n− conduction type drift layer 2. With this operation, positive holes are injected from the p conduction type collector layer 6 to the n− conduction type drift layer 2, and then, the device is turned on. In this case, as a modulation in the electric conductivity is associated, ON resistance of IGBT is very small in comparison with very high ON resistance of MOSFET. In this embodiment, ON voltage is 1.5 V for the current 200A/cm$^2$ and ON resistance is 7.5 mΩcm$^2$. In case that the gate voltage is so adjusted that the electric potential of the trench type insulated gate electrode 14 may be smaller than the electrode of the emitter electrode 13, and that the electric potential of the collector electrode 12 may be higher than the electric potential of the emitter electrode 13, depletion layers are extended at the both sides of the junction between the n− conduction type drift layer 2 and the p conduction type body layer 4, and the electric field strength can be relaxed and a high withstand voltage can be established for high voltage application. In this embodiment, other than the depletion layer supporting the applied voltage, depletion layers are developed also below the trench type insulated gate electrode 14 at the junction between the p conduction type electric field relaxation semiconductor region 1 and the n− conduction type drift layer 2, and thus, a high withstand voltage can be established for high voltage application. Therefore, below the trench type insulated gate electrode 14, almost all of the applied voltage is supported by the electric field relaxation semiconductor region 1 and the n− conduction type drift layer 2. Hence, the voltage applied to the insulator layer 9 below the bottom portion of the gate becomes smaller and the electric field strength in the insulator layer 9 is relaxed. Thus, the reliability of the gate insulator layer 9 can be also increased. In addition, the electric field strength in the gate insulator layer 9 can be relaxed and a high withstand voltage can be established for high voltage application. In this embodiment, similarly to the embodiment 1 for MOSFET, the electric field strength of the insulator layer 9 at the bottom portion and the lateral end portion of the trench type insulated gate 14 is reduced by 45 to 65% in comparison with the conventional IGBT having a structure without an electric field relaxation semiconductor region 1. Thus, also in this embodiment, as the electric field strength in the insulator layer 9 is relaxed, a high withstand voltage can be established for high voltage application, and the reliability of the gate insulator layer 9 can be also increased. For example, it is proved that the withstand voltage of the semiconductor device increases from 2900V to 3250V.

Embodiment 5

Figure 5:
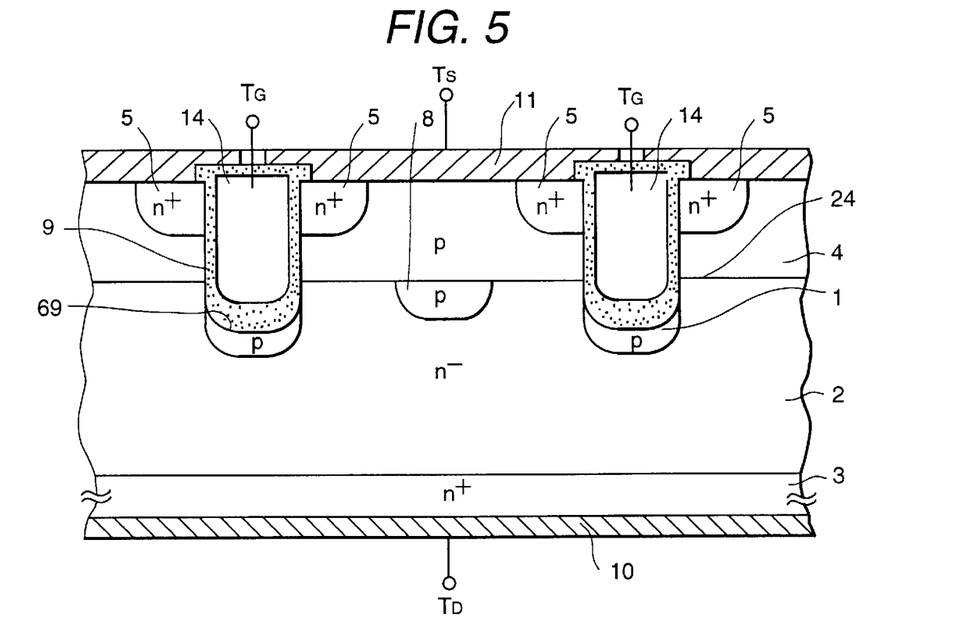
FIG. 5 is a cross-sectional view of the insulated gate semiconductor device of the embodiment 5 of the present invention.

FIG. 5 shows a cross-sectional view of the unit segment of n channel SiC(silicon carbide) MOSFET in the embodiment 5 of the present invention. In the structure of the device of the embodiment 5, a second electric field relaxation semiconductor region 8 is additionally formed as the third semiconductor region having the second conduction type (p) in the n conduction type channel SiC MOSFET in the embodiment 3. The electric field relaxation semiconductor region 8 has a 0.5 mm thickness and its surface impurity density is $10^{17}$ atm/cm$^3$ having the p conduction type opposite to the n− conduction type drift layer 2. Fabrication method up to forming the n− conduction type drift layer 2 in this embodiment is similar to that for MOSFET in the embodiment 3. Major difference in the fabrication method from the embodiment 3 is that, after forming the n− conduction type drift layer 2, and the second electric field relaxation semiconductor region 8 is formed by injecting selectively boron (or alternatively aluminum) with ion implantation method and so on. The fabrication procedures after this process is completely equivalent to those in the embodiment 3, and their detailed description will be cut out.

In MOSFET of the embodiment 3, as the electric field strength of the insulator layer 9 at the literal end portion of the bottom of the trench type insulated gate 14 becomes larger, the withstand voltage of the device itself is determined by the electric field strength of this portion. In contrast, in the device formed with the second electric field relaxation semiconductor region 8 as in this embodiment, the depletion layer is developed at the junction between the second electric field relaxation semiconductor region 8 and the drift layer 2, and connected to the depletion layer formed at the junction between the electric field relaxation semiconductor region 1 below the trench type insulated gate 14 and the n− conduction type drift layer 2. This depletion layer extends in the n− conduction type drift layer 2 to the side of the drain electrode 10. As a result, the voltage applied between the drain electrode and the source electrode is supported also by the extended depletion layer. Consequently, the voltage supported by the insulator layer 9 becomes further smaller ad the electric field strength becomes further relaxed. In this embodiment, the electric field strength is relaxed by 55% to 80% in comparison with the conventional device. Therefore, the withstand voltage increases by about 55% or more in the semiconductor device in comparison with the conventional device, and, for example, the withstand voltage is improved from 3100V up to 3600V. Owing to the relaxation of the electric field strength described above, the reliability of the insulator layer 9 can be further increased. In the experimental result with 3000V application test, the lifetime of the device extends two times larger than the conventional device.

Embodiment 6

Figure 6:
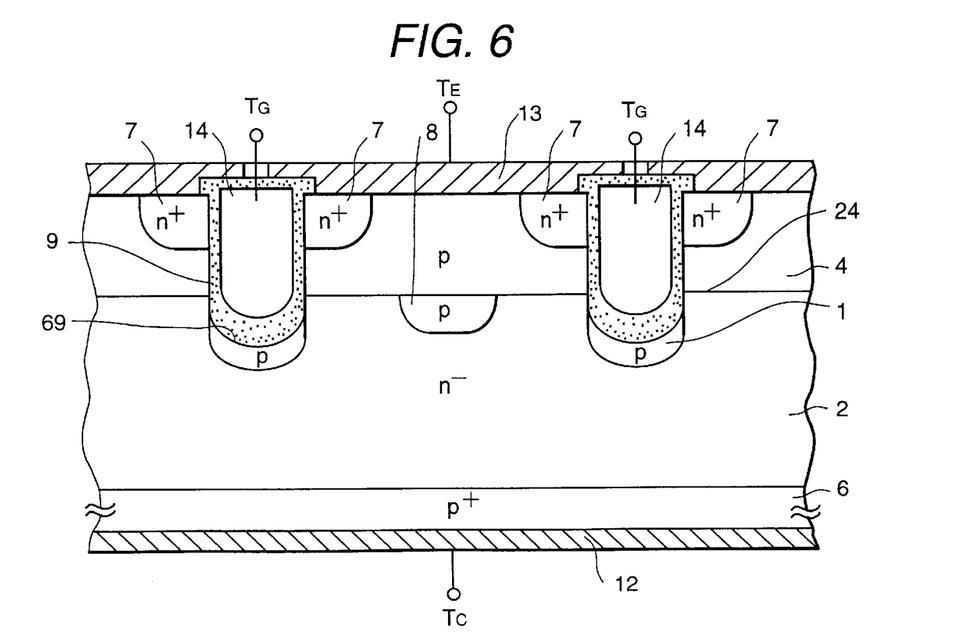
FIG. 6 is a cross-sectional view of the insulated gate semiconductor device of the embodiment 6 of the present invention.

FIG. 6 shows a cross-sectional view of the segment of n channel SiC(silicon carbide) IGBT in the embodiment 6 of the present invention. In the embodiment 6, the device has a structure that a second electric field relaxation semiconductor region 8 is formed in the n channel SiC IGBT. This structure is one that a p+ conduction type collector layer 6 is formed instead of the n+ conduction type drain layer 3 in the embodiment 3. In the structural specifications and fabrication method of the embodiment 6, a p conduction type SiC substrate is used instead of the n conduction type SiC substrate used in the embodiment 5 and the density of the drain layer is made to be slightly smaller and the thickness and the film quality of the insulator layer 9 is increased. The impurity density of the p+conduction type substrate is between $10^{18}$ atm/cm$^3$ and $10^{19}$ atm/cm$^3$. In this embodiment, similarly to the embodiment 5, the effect by forming the second electric field relaxation semiconductor region 8 can be seen as the relaxation of the electric field strength in the insulator layer 9. In this embodiment, the electric field strength is relaxed by approximately 65% to 130% in comparison with the conventional device. Therefore, the withstand voltage is increased by about 25% or more in this semiconductor device, and the withstand voltage can be increased from 3300V to 4600V. Owing to the relaxation of the electric field strength described above, the reliability of the insulator layer 9 can be increased.

Embodiment 7

Figure 7:
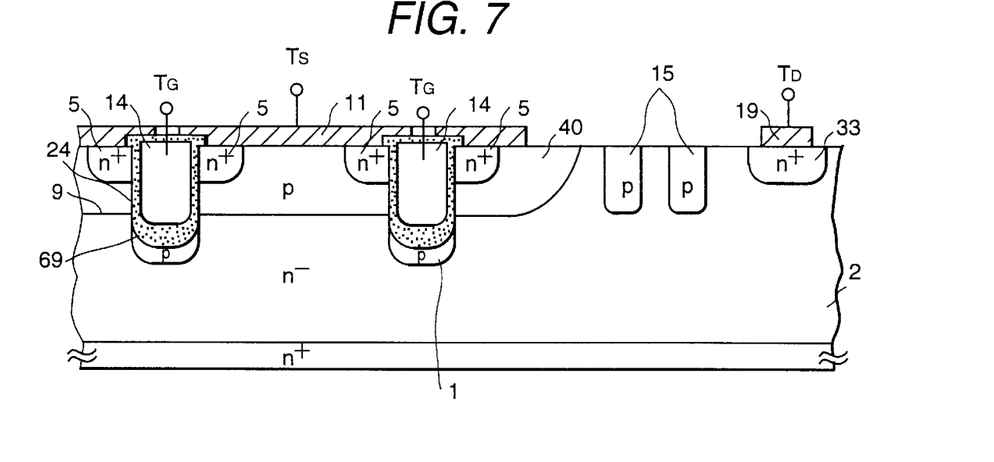
FIG. 7 is a cross-sectional view of the insulated gate semiconductor device of the embodiment 7 of the present invention.

FIG. 7 shows a cross-sectional view of the unit segment of n channel SiC(silicon carbide) MOSFET in the embodiment 7 of the present invention. In the embodiment 7, the drain electrode 19 is not formed on the drain layer 3 as in the embodiments 1 to 4 but formed on the drift layer 2 on which the body layer 4 is to be formed. The device having such a structure is designated a horizontal-type insulated gate semiconductor device. In this embodiment 7, instead of the p conduction type body layer 4 used in the previous embodiments, a p conduction type body region 40 having a definite region, for example, shaped in a stripe is formed. The n+ conduction type drain region 33 is formed at a definite distance from the body region 40 on the drift layer 2. The drain electrode 19 is formed on the drain region 33.

It is preferable to form the drain electrode 19 at a definite distance from the insulated gate electrode 14 so as to be parallel to the insulated gate electrode 14. One or more p conduction type termination region 15 is formed between the drain electrode 19 and the body region 40, substantially parallel to the body region 40. The termination region 15 is used for relaxing the concentration of the electric field at the end portion of the body region. The detailed structure other than the portions described above is similar to that shown in FIG. 1.

As the source terminal and the drain terminal are defined in the identical direction in the horizontal-type insulated gate semiconductor device, the wiring work is made to be easier when embedding the device in hybrid IC's and so on. In addition, as the drain electrode 19 is formed in the individual semiconductor devices, the degree of freedom in connecting devices increases.

The structure of the drain region and the drain electrode 19 described in the embodiment 7 is applicable to the structure of the embodiment 5 shown in FIG. 5.

By means that the p+ conduction type collector region corresponding to the collector layer 6 in the embodiment 2 shown in FIG. 2, the embodiment 4 shown in FIG. 4 and the embodiment 6 show in FIG. 6 is formed on the surface on the body layer 4 and that a collector electrode is formed in the collector region, the device of the embodiment 7 can be applied to the devices in the embodiments 2, 4 and 6.

Embodiment 8

Figure 8:
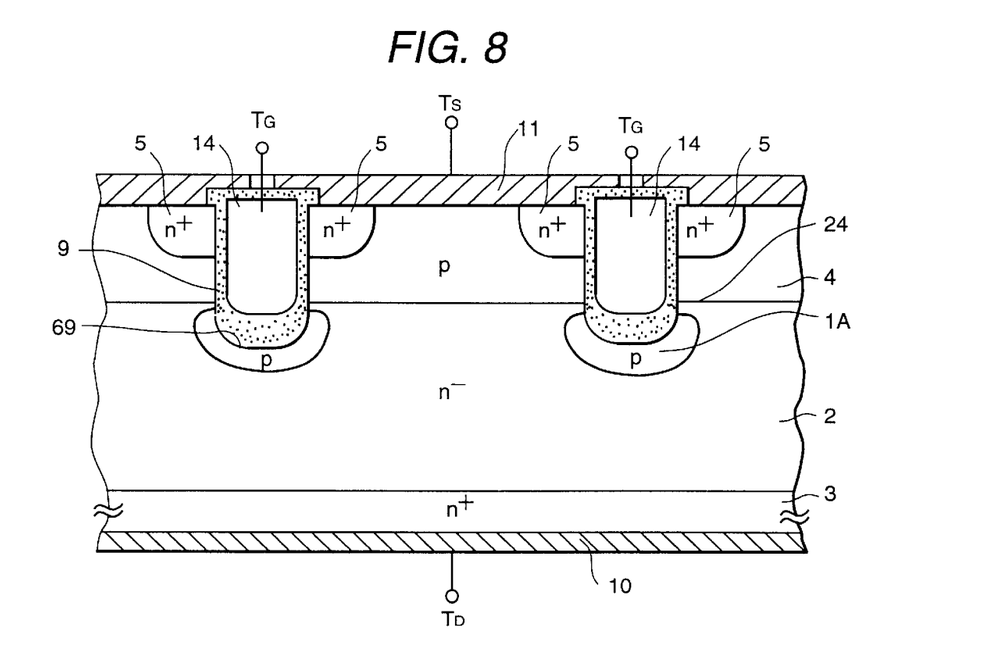
FIG. 8 is a cross-sectional view of the insulated gate semiconductor device of the embodiment 8 of the present invention.

FIG. 8 shows a cross-sectional view of the unit segment of n channel SiC(silicon carbide) MOSFET in the embodiment 8 of the present invention. Though the structure of the device of the embodiment 8 is almost the same as the structure in the embodiment, the shape of the cross-section of the electric field relaxation semiconductor region and its fabrication process is different from the embodiment 3. In the embodiment 8, after forming the trench 69, when the electric field relaxation semiconductor region 1A is formed, the amount of boron ion to be implanted is made to be higher than the embodiment 3. Owing to this procedure, the diffusion of boron in the horizontal direction in the n– conduction type drift layer 2 becomes more actively made at the both end portions of the bottom of the trench, and the electric field relaxation semiconductor region 1A is so shaped that its side extension is large and equivalent to its depth. As a result, the electric field strength of the insulator layer 9 at the literal end portion of the bottom of the trench type insulated gate 14 is further relaxed, and higher withstand voltage can be realized. This can be realized because the applied voltage is supported by the extended region of the electric field relaxation semiconductor region 1A. For example, in contrast to the withstand voltage 2900V to 3250V in the semiconductor device of the embodiment 3, the withstand voltage in the embodiment 8 shown in FIG.8 is 3200V to 3500V, and in addition, the reliability of the device can be increased. In the structure of the device shown in FIG. 8, ON resistance is slightly increased, but there is no problem in practical use. The electric field relaxation semiconductor region 1A with its both sides extended widely can be applied to the devices shown in the embodiments 1 to 7.

The structure of the drain region and the drain electrode 19 shown in the embodiment 7 before can be applied to the structure of the embodiment 8 shown in FIG. 8.

Embodiment 9

Figure 9:
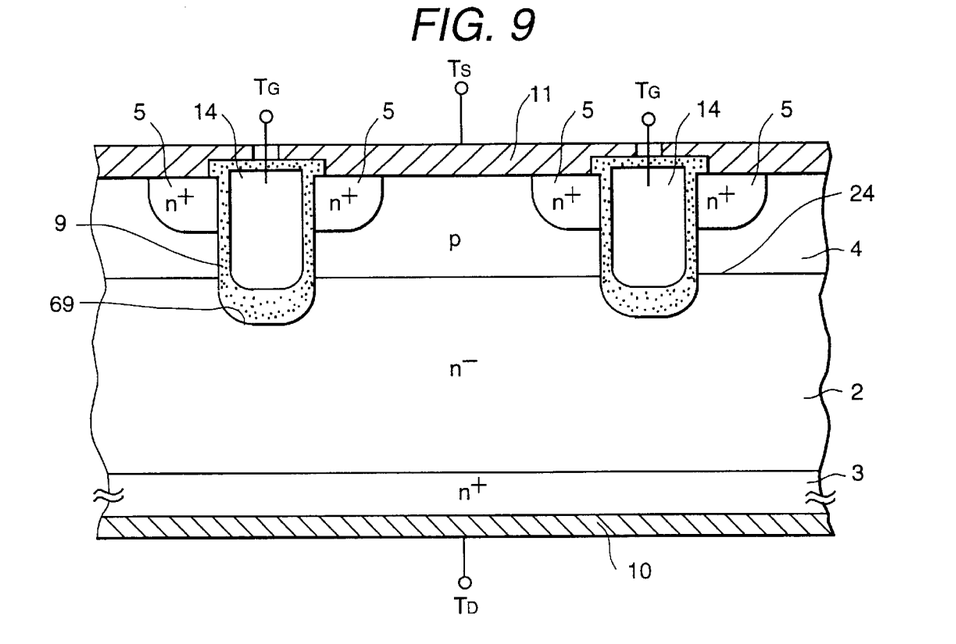
FIG. 9 is a cross-sectional view of the insulated gate semiconductor device of the embodiment 9 of the present invention.

FIG. 9 shows a cross-sectional view of the unit segment of n channel SiC(silicon carbide) MOSFET of withstand voltage 2500V class in the embodiment 9 of the present invention. In this embodiment, the applied voltage support is increased by means of making the thickness of the bottom portion of the trench larger 20 times or more than the thickness of the insulator layer 9 at the lateral of the trench 69. In this embodiment, the width of the segment is 5 $\mu$m and its depth is 1 mm. Other structural specification is as described below. The n– conduction type drift layer 2 is formed on the n+ conduction type drain layer 3 and its thickness is about 20 $\mu$m. The thickness of the n+30 conduction type drain layer 3 is about 300 $\mu$m, the thickness of the p conduction type body layer 4 is 4 $\mu$m, and the junction depth of the n+ conduction type source region 5 is 0.5 $\mu$m, the depth of the concave portion, that is, trench 69 is 6 $\mu$m, the width of the trench is 3 $\mu$m, and the thickness of the insulator layer 9 composed of SiO2 (silicon oxide) formed in the trench 69 is 1 mm at the bottom of the trench 69 and 0.1 mm at the lateral of the trench 69. In this embodiment, the trench type insulated gate electrode 14 is shaped in a stripe extended in the depth direction vertical to the surface of the drawing sheet. The projected shape of the trench may be a circular hole having a 3 $\mu$m diameter or a square other than a stripe extended in the depth direction vertical to the surface of the drawing sheet. The trenches are arranged at regular intervals, for example, with 5 $\mu$m pitch. In case of a circular trench, trenches may be arranged on a rectangular grid vertically and horizontally or on a staggered grid diagonally.

A specific method of fabricating the device of this embodiment is described as below. At first, what is prepared is an n+ type SiC (silicon carbide) substrate 3 to be used as a drain region composed of SiC with the density between $10^{18}$ atm/cm$^3$ and $10^{20}$ atm/cm$^3$, for example, $10^{19}$ atm/cm$^3$. An n– conduction type drift layer 2 composed of SiC with the density between $10^{15}$ atm/cm$^3$ and $10^{16}$ atm/cm$^3$, for example, 5×$10^6$ atm/cm$^3$ is formed on the whole surface of the substrate 3 by vapor phase epitaxy method and so on. Next, a p conduction type body layer 4 composed of SiC with the density about $10^{16}$ atm/cm³ is formed on the drift layer 2 by vapor phase epitaxy method and so on. An n+ conduction type region 5 with the density about $10^{18}$ atm/cm³ is formed selectively as a source layer by nitrogen ion implantation method and so on. (phosphoric ion is allowed instead of nitrogen ion.)

Next, as shown in FIG. 9, a comprehensive substrate including the substrate 3, the drift layer 2 and the body layer 4 is processed by anisotropic etching, and a trench (channel) 69 penetrating the p conduction type body layer 4 and with its bottom portion reaching the n– conduction type drift layer 2 is formed. Subsequently, a gate insulator film 9 composed of SiO2 is formed on the inner surface of the trench 69, and the SiO2 gate insulator film 9 at the bottom of the trench is selectively developed by vapor phase epitaxy method until its thickness reaches about 1 μm. Poly-silicon is made to be deposited in the trench 69 as a gate region containing high-density phosphor, and thus, the gate region 14 is formed in the trench 69. For example, the depth of the trench 69 is 6 μm, its width is 3 m and its length is 1 mm. This size is an example but can be modified if necessary. By removing excess poly-silicon on the surface of the substrate other than the poly-silicon in the trench 69, the trench type insulated gate electrode 14 is formed. Finally, by means of aluminum (or alternatively nickel), a source electrode 11 is formed on the surface of the substrate and a drain electrode 10 is formed on the rear face of the substrate, and an insulated gate semiconductor device (MOSFET) is obtained. An ON resistance of this MOSFET device is about 30 mΩcm².

The device of this embodiment is an n channel SiC MOSFET, in which the gate voltage to be applied is so adjusted that the electric potential of the drain electrode 10 may be higher than the electric potential of the source electrode 11 and that the electric potential of the trench type insulated gate electrode 14 may be higher than the electric potential of the source electrode 11. In case that the gate voltage becomes higher than a designated threshold voltage, an n conduction type channel is formed on the surface of the p conduction type body layer 4 at the lateral of the trench type insulated gate electrode 14. Then, electrons flow from the n+ conduction type source region 5 through the channel to the n– conduction type drift layer 2 and furthermore to the n+ conduction type drain layer 3, and consequently, the semiconductor device is turned on. In contrast, in case that the gate voltage is so adjusted that the electric potential of the trench type insulated gate electrode 14 may be smaller than the electrode of the source electrode 11, and that the electric potential of the drain electrode 10 may be higher than the electric potential of the source electrode 11, depletion layers are extended at the both sides of the junction between the n– conduction type drift layer 2 and the p conduction type body layer 4. Owing to those depletion layer, the electric field strength can be relaxed and a high withstand voltage can be established for high voltage application.

In this embodiment, by means that the thickness of the insulator layer 9 at the bottom of the trench is 1 μm, that is, several times or ten times larger than the thickness of the insulator layer 9 at the literal of the trench, the electric field at the bottom portion and the literal end portion of the insulator layer 9 can be relaxed. Thus, the withstand voltage of the device can be increased, or the reliability of the gate insulator layer 9 can be increased.

In the computational simulation, in case of a conventional trench type insulated gate MOSFET shown in FIG. 11, the trench type insulated gate electrode 14 and the source electrode 11 are made short and the electric potential of the source electrode 11 is set to be 0V and +2000V is applied to the drain electrode 10, the electric field strength of the insulator layer 9 composed of SiO2 at the bottom portion of the trench type insulated gate is larger than the value between 6 to 10 MV/cm equivalent to the breakdown electric field strength of SiO2. In contrast, in case of such a device as MOSFET in this embodiment in which the thickness of the insulator layer 9 is made to be 1 ?m, the electric field strength of the SiO2 insulator layer 9 at the lateral end portion of the bottom portion of the trench type insulated gate is reduced by 90% in comparison with the conventional device. The reliability of the insulator layer decreases remarkably when the electric field strength reaches its breakdown electric field strength. In this embodiment, as the electric field strength of the insulator layer 9 becomes small to a large extent, the reliability of the device itself increases much. As a result, the withstand voltage of the semiconductor device increases from 2900V to 3250V. In addition, by making the thickness of the n– drift layer larger, much higher withstand voltage can be obtained. The applied at the drain electrode 10 is supported by the n– conduction type drift layer 2 and the insulator layer 9 at the bottom of the trench type insulated gate 14, and the fraction of the supported voltage at the insulator layer 9 is larger and consequently, its electric field strength is larger. However, by means that the thickness of the insulator layer at the bottom of the trench type insulated gate 14 is made to be about 1 μm or larger as in this embodiment, the applied voltage is supported by the n– conduction type drift layer 2 and the insulator layer at the bottom portion of the trench type insulated gate, and especially, the major portion of the voltage applied between the drain and the source are supported by the bottom portion of the insulator layer 9. However, as the thickness of the insulator layer 9 is increased, the electric field strength in the insulator layer 9 becomes smaller.

As the electric field strength in the insulator layer 9 at the bottom of the trench type insulated gate 14 is especially high in device having higher withstand voltage, the effect of making the thickness of the bottom portion of the insulator layer 9 arises remarkably.

In the embodiment 9, if applying the device structure corresponding to the second electric field relaxation semiconductor region 8 in the embodiment 5, the effect brought by the device of the embodiment 5 can be obtained.

In the embodiment 9, if forming the drain electrode 19 so as to be located at a definite distance from the insulated gate electrode 14 and parallel to the insulated gate electrode 14 as defined in the embodiment 7, the effect brought by the device of the embodiment 7 can be obtained.

Embodiment 10

Figure 10:
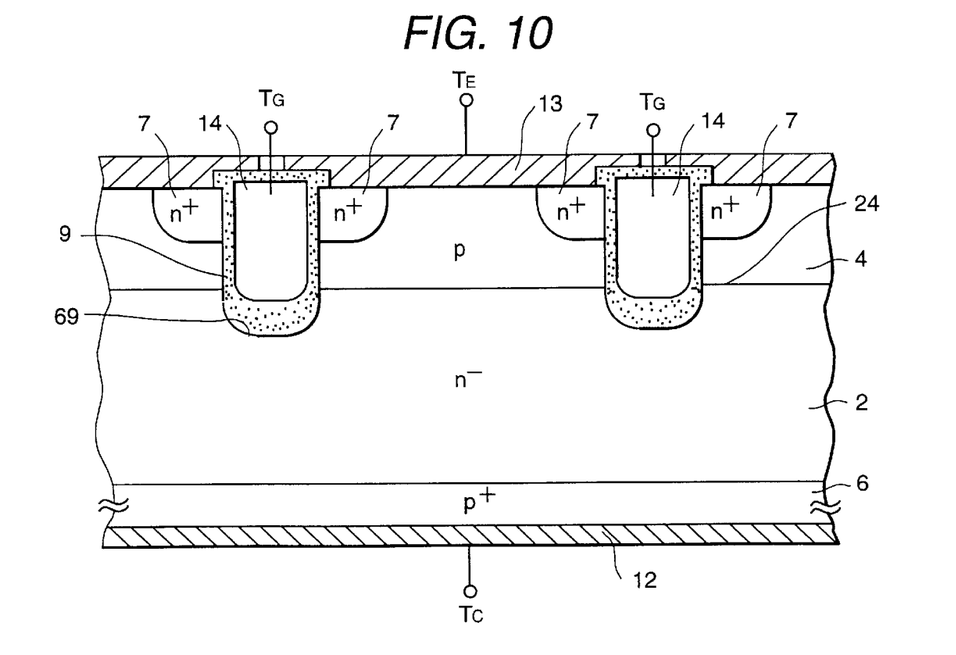
FIG. 10 is a cross-sectional view of the insulated gate semiconductor device of the embodiment 10 of the present invention.

FIG. 10 is a cross-sectional view of the unit of n channel SiC IGBT in the embodiment 10 of the present invention. In the structure of the device in FIG. 4, the p conduction type collector layer 6 is formed instead of the n+ conduction type drain layer 3 in the embodiment 9. In the structural specifications and fabrication method in the embodiment 10, a difference from the embodiment 9 is only that a SiC p+ conduction type substrate is used instead of a SIC n+ conduction type substrate, but other aspects are similar to the embodiment 9. The impurity density of the p+ conduction type substrate is between $10^{18}$ atm/cm³ and $10^{19}$ atm/cm³.

In the operation of the n channel IGBT of this embodiment, at first, the gate voltage to be applied is so adjusted that the electric potential of the collector electrode 12 may be higher than the electric potential of the emitter electrode 11 and that the electric potential of the trench type insulated gate electrode 14 may be higher than the electric potential of the emitter electrode 13. In case that the gate voltage becomes higher than a designated threshold voltage, an n conduction type channel is formed on the surface of the p conduction type body layer 4 at the lateral of the trench type insulated gate electrode 14, and then, electrons flow from the n+ conduction type emitter region 7 through the channel to the n− conduction type drift layer 2. With this operation, positive holes are injected from the p conduction type collector layer 6 to the n− conduction type drift layer 2, and then, the device is turned on. In this case, as a modulation in the electric conductivity is associated, ON resistance of IGBT is very small in comparison with very high ON resistance of MOSFET. In this embodiment, ON voltage is 1.5 V for the current 200A/cm$^2$ and ON resistance is 7.5 mΩcm$^2$. In case that the gate voltage is so adjusted that the electric potential of the trench type insulated gate electrode 14 may be smaller than the electrode of the emitter electrode 13, and that the electric potential of the collector electrode 12 may be higher than the electric potential of the emitter electrode 13, depletion layers are extended at the both sides of the junction between the n− conduction type drift layer 2 and the p conduction type body layer 4, and the electric field strength can be relaxed and a high withstand voltage can be established for high voltage application.

In this embodiment, below the trench type insulated gate electrode 14, almost all of the applied voltage is supported by the bottom portion of the insulator layer 9, and by making the thickness of the bottom portion of the insulator layer 9 larger, the electric field length at the bottom portion and the lateral end portion can be relaxed. Thus, the reliability of the gate insulator layer 9 can be also increased. In addition, the electric field strength in the gate insulator layer 9 can be relaxed and a high withstand voltage can be established for high voltage application. In this embodiment, similarly to the embodiment 1 for MOSFET, the electric field strength of the insulator layer 9 at the bottom portion and the lateral end portion of the trench type insulated gate 14 is reduced by 90% in comparison with the conventional IGBT having a structure without making the thickness of the gate insulator layer 9 larger. Thus, also in this embodiment, as the electric field strength in the insulator layer 9 is relaxed, a high withstand voltage can be established for high voltage application, and the reliability of the gate insulator layer 9 can be also increased. For example, it is proved that the withstand voltage of the semiconductor device increases from 2900V to 3250V.

In the embodiment 10, if applying the device structure corresponding to the second electric field relaxation semiconductor region 8 in the embodiment 6, the effect brought by the device of the embodiment 6 can be obtained.

In the embodiment 10, if forming the collector electrode 12 so as to be located at a definite distance from the insulated gate electrode 14 and parallel to the insulated gate electrode 14 as defined in the embodiment 7, the effect brought by the device of the embodiment 7 can be obtained.

The embodiments 1 to 10 of the present invention has been described, but the present invention is not limited to the devices in those embodiments, but applicable to trench type MOS thyristor, trench type static induction transistor, thyristor and IEGT (Injection Enhanced Insulated Gate Bipolar Transistor), and furthermore, various modifications and applications are allowable. The insulator layer 9 may be composed of Ta2O5 (tantalum oxide), Si3N4 (silicon nitride) and AlN (aluminum nitride) other than SiO2. Though the gate in the embodiments of the present invention is structured to be embedded with the trench, the structure of the gate is not necessarily limited to this but allowed to be formed as a thin film as a portion of the inner wall of the trench with the SiO2 insulator layer 9.

In the insulated gate semiconductor device in the present invention, by means that the first semiconductor region of the second conduction type at the bottom of the trench type insulated gate, the electric field strength which was high in the semiconductor device formed with the conventional trench type insulated gate structure can be relaxed. As a result, the withstand voltage of the semiconductor device can be increased by 15 to 30% in comparison with the conventional semiconductor device. The relaxation of the electric field strength makes the reliability of the insulator layer increase.

In the insulated gate semiconductor device in the present invention, by means that the first semiconductor region of the second conduction type at the bottom of the trench type insulated gate and that the thickness of the insulator layer at the bottom of the trench type insulated gate is made to be larger than the thickness of the lateral portion of the insulator layer, the electric field strength of the insulator layer at the bottom portion of the trench type insulated gate which was high in the semiconductor device formed with the conventional trench type insulated gate structure can be further relaxed. As a result, the withstand voltage of the semiconductor device can be increased by 45 to 65% in comparison with the conventional semiconductor device. The relaxation of the electric field strength makes the reliability of the insulator layer increase.

And furthermore, by means that the semiconductor substrate of the insulated gate semiconductor device of the present invention is so structured as to be formed on the substrate having higher conductivity and with the same of conduction type and with a layer having lower conductivity, the contact resistance between the second electrode and the semiconductor substrate can be reduced to be small. Thus, by forming a layer having lower conductivity, the withstand voltage of the semiconductor device itself can be increased.

In addition, by means of making the conductivity of the second semiconductor region of the insulated gate semiconductor device of the present invention higher than the conductivity of the layer forming a junction with the semiconductor layer having the second conduction type forming a junction with the semiconductor substrate on the semiconductor substrate, the contact resistance between the first electrode and the second semiconductor region can be made small and ON resistance of the semiconductor device can be reduced.

In the insulated gate semiconductor device having a semiconductor layer of the second conduction type on the rear face of the face having a junction with the semiconductor substrate, by means of forming the first semiconductor region of the second conduction type at the bottom of the trench gate, the electric field strength of the insulator layer at the bottom portion of the trench type insulated gate which was high in the semiconductor device formed with the conventional trench type insulated gate structure can be further relaxed. As a result, the withstand voltage of the semiconductor device can be increased by 15 to 30% in comparison with the conventional semiconductor device. The relaxation of the electric field strength makes the reliability of the insulator layer increase.

In the insulated gate semiconductor device having a semiconductor layer of the second conduction type on the rear face of the face having a junction with the semiconductor substrate, by means of forming the first semiconductor region of the second conduction type at the bottom of the trench gate and that the thickness of the insulator layer at the bottom of the trench type insulated gate is made to be larger than the thickness of the lateral portion of the insulator layer, the electric field strength of the insulator layer at the bottom portion of the trench type insulated gate which was high in the semiconductor device formed with the conventional trench type insulated gate structure can be further relaxed. As a result, the withstand voltage of the semiconductor device can be increased by 45 to 65% in comparison with the conventional semiconductor device. The relaxation of the electric field strength makes the reliability of the insulator layer increase.

By means that forming the third semiconductor region of the second conduction type in the semiconductor substrate of the insulated gate semiconductor device of the present invention, the electric field strength of the insulator layer at the bottom portion of the trench type insulated gate can be relaxed much more than the case of forming only the first semiconductor region of the second conduction type. As a result, the withstand voltage of the semiconductor device can be increased by 55 to 130% in comparison with the conventional semiconductor device. The relaxation of the electric field strength makes the reliability of the insulator layer higher.

In the horizontal-type semiconductor device in which the second electrode is formed in the direction identical to the direction in which the first electrode is formed, the withstand voltage or the reliability can be increased, and in addition, as the individual semiconductor devices have the second electrodes in an identical direction, the degree of freedom in connecting devices increases and the degree of integration can increases.

By means that the first electric field relaxation semiconductor region of the second conduction type is formed at the bottom portion of the trench as well as the lateral portion connected to the bottom portion, the electric field strength of the insulator layer at the lateral portion at the bottom of the trench type insulated gate can be further relaxed, and the withstand voltage can be increased. By means of the relaxation of the electric field strength of the insulator layer, the reliability of the insulator layer can be increased.

By means of making the thickness of the bottom portion of the insulator layer much larger than the thickness of the lateral portion of the insulator layer, the electric field at the boundary between the bottom portion and the lateral portion of the insulator layer can be much relaxed, and the withstand voltage can be increased. By means of the relaxation of the electric field strength of the insulator layer, the reliability of the insulator layer can be increased.

In addition, by forming the first semiconductor region of the second conduction type, further increase in the withstand voltage and the reliability can be established.

What is claimed is:

1. A wide-gap semiconductor device comprising:
   a semiconductor substrate exhibiting a first conductivity type;
   a semiconductor layer exhibiting a second conductivity type opposite to said first conductivity type deposited on said semiconductor substrate and forming a junction to said semiconductor substrate;
   at least one concave portion penetrated through said semiconductor layer to reach and cut partially into said semiconductor substrate;
   a first semiconductor region exhibiting said second conductivity type and having an impurity concentration higher than that of said semiconductor substrate, formed in said semiconductor substrate at a bottom of said concave portion;
   an insulator layer formed on an inner surface of said concave portion;
   a gate insulated by said insulator layer with said semiconductor substrate and said semiconductor layer and at least partially formed in said concave portion;
   a second semiconductor region exhibiting said first conductivity type formed at a surface of said semiconductor layer with a designated depth at a peripheral area of said gate surrounded by said insulator layer in said semiconductor layer;
   a first electrode formed on said semiconductor layer and said second semiconductor region and defined to be electrically conductive to said semiconductor layer and said second semiconductor region; and
   a second electrode defined at another portion of said semiconductor substrate,
      wherein said semiconductor substrate has a first semiconductor layer formed on another semiconductor layer having a higher electric conductivity, said first semiconductor layer having a conductivity type identical to that of said another semiconductor layer and an electric conductivity lower than that of said semiconductor layer.

2. A wide-gap semiconductor device comprising:
   a semiconductor substrate exhibiting a first conductivity type;
   a semiconductor layer exhibiting a second conductivity type opposite to said first conductivity type deposited on said semiconductor substrate and forming a junction to said semiconductor substrate;
   at least one concave portion penetrated through said semiconductor layer to reach and cut partially into said semiconductor substrate;
   a first semiconductor region exhibiting said second conductivity type and having an impurity concentration higher than that of said semiconductor layer, formed in said semiconductor substrate at a bottom of said concave portion;
   an insulator layer formed on an inner surface of said concave portion;
   a gate insulated by said insulator layer with said semiconductor substrate and said semiconductor layer and at least partially formed in said concave portion;
   a second semiconductor region exhibiting said first conductivity type formed at a surface of said semiconductor layer with a designated depth at a peripheral area of said gate surrounded by said insulator layer in said semiconductor layer;
   a first electrode formed on said semiconductor layer and said second semiconductor region and defined to be electrically conductive to said semiconductor layer and said second semiconductor region; and
   a second electrode defined at another portion of said semiconductor substrate,
      wherein said semiconductor substrate has a first semiconductor layer formed on another semiconductor layer having a higher electric conductivity, said first semiconductor layer having a conductivity type identical to that of said another semiconductor layer and an electric conductivity lower than that of said semiconductor layer.

3. A wide-gap semiconductor device of claim 1, wherein said second semiconductor region has an electric conductivity higher than that of a portion of said semiconductor substrate forming said junction to said semiconductor layer.

4. A wide-gap semiconductor device of claim 1, wherein said semiconductor layer exhibiting said second conductivity type is formed on a surface opposite to the surface of said semiconductor substrate having said junction.

5. A wide-gap semiconductor device of claim 1, further comprising a third semiconductor region exhibiting said second conductivity type formed in said semiconductor substrate so as to be separated from said concave portion.

6. A wide-gap semiconductor device of claim 4, wherein said semiconductor layer exhibiting said second conductivity type is formed on a surface opposite to the surface of said semiconductor substrate having said junction; and a third semiconductor region exhibiting said second conductivity type is in said semiconductor substrate so as to be separated from said concave portion in said semiconductor substrate.

7. A wide-gap semiconductor device of claim 1, wherein said second electrode is formed on said semiconductor substrate separated from said first electrode by a designated distance.

8. A wide-gap semiconductor device of claim 1, wherein said first semiconductor region formed in said semiconductor substrate is formed at a bottom of said concave portion and at a lateral portion connected to the bottom of said concave portion.

9. A wide-gap semiconductor device of claim 2, wherein said second semiconductor region has an electric conductivity higher than that of a portion of said semiconductor substrate forming said junction to said semiconductor layer.

10. A wide-gap semiconductor device of claim 2, wherein said semiconductor layer exhibiting said second conductivity type is formed on a surface opposite to the surface of said semiconductor substrate having said junction.

11. A wide-gap semiconductor device of claim 10, wherein said semiconductor layer exhibiting said second conductivity type is formed on a surface opposite to the surface of said semiconductor substrate having said junction; and a third semiconductor region exhibiting said second conductivity type is in said semiconductor substrate so as to be separated from said concave portion in said semiconductor substrate.

12. A wide-gap semiconductor device of claim 2, further comprising a third semiconductor region exhibiting said second conductivity type formed in said semiconductor substrate so as to be separated from said concave portion.

13. A wide-gap semiconductor device of claim 2, wherein said second electrode is formed on said semiconductor substrate separated from said first electrode by a designated distance.

14. A wide-gap semiconductor device of claim 2, wherein said first semiconductor region formed in said semiconductor substrate is formed at a bottom of said concave portion and at a lateral portion connected to the bottom of said concave portion.

15. A wide-gap semiconductor device comprising:
a semiconductor substrate exhibiting a first conductivity type;
a semiconductor layer exhibiting a second conductivity type opposite to said first conductivity type deposited on said semiconductor substrate and forming a junction with said semiconductor substrate;
at least one concave portion penetrated through said semiconductor layer to reach and cut partially into said semiconductor substrate;
a first semiconductor region exhibiting said second conductivity type and having an impurity concentration higher than that of said semiconductor substrate, formed in said semiconductor substrate at a bottom of said concave portion;
an insulator layer formed on an inner surface of said concave portion, and having a thickness larger than a lateral portion of said concave portion at the bottom of said concave portion;
a gate insulated by said insulator layer with said semiconductor substrate and said semiconductor layer and at least partially formed in said concave portion;
a second semiconductor region exhibiting said first conductivity type formed at a surface of said semiconductor layer with a designated depth at a peripheral area of said gate surrounded by said insulator layer in said semiconductor layer;
a first electrode formed on said semiconductor layer and said second semiconductor region and defined to be electrically conductive to said semiconductor layer and said second semiconductor region; and
a second electrode defined at another portion of said semiconductor substrate.

16. A wide-gap semiconductor device of claim 15, wherein said semiconductor layer exhibiting said second conductivity is formed on a surface opposite to the surface of said semiconductor substrate having said junction.

17. A wide-gap semiconductor device comprising:
a substrate exhibiting a first conductivity type;
a semiconductor layer exhibiting a second conductivity type opposite to said first conductivity type deposited on said substrate;
at least one trench having an opening in a surface of said semiconductor layer and a depth extending through said substrate;
an electric field relaxation region exhibiting said second conductivity type and having an impurity concentration higher than that of said semiconductor layer, formed in said substrate below a bottom of said trench;
an insulator layer formed on a surface of said trench;
a gate electrode deposited in said trench and insulated from said substrate and said semiconductor layer by said insulator layer;
an electrical conduction region exhibiting said first conductivity type formed in said semiconductor layer surrounding said gate electrode insulated by said insulator layer;
a source electrode formed on said semiconductor layer and said electrical conduction region; and
a gate electrode formed at another portion of said semiconductor substrate.

18. A wide-gap semiconductor device of claim 17, wherein said first conductivity type is a n-type dopant, and said second conductivity type is a p-type dopant.

19. A wide-gap semiconductor device of claim 17, further comprising another electric field relaxation region exhibiting said second conductivity type formed in said substrate but separated from said electric field relaxation region formed in said substrate below the bottom of said trench.

20. A wide-gap semiconductor device of claim 17, wherein said electric field relaxation region has a depth of 0.5 microns and a density of approximately $10^{17}$ atm/cm$^3$ formed below the bottom of said trench by either boron or aluminum ion implantation.

* * * * *